US009389284B2

(12) United States Patent
Motz

(10) Patent No.: US 9,389,284 B2
(45) Date of Patent: Jul. 12, 2016

(54) SPINNING CURRENT HALL SENSOR WITH RESIDUAL OFFSET CALIBRATION SIGNAL

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/828,759

(22) Filed: Aug. 18, 2015

(65) Prior Publication Data

US 2015/0355293 A1     Dec. 10, 2015

Related U.S. Application Data

(60) Continuation of application No. 13/443,099, filed on Apr. 10, 2012, now Pat. No. 9,110,121, which is a division of application No. 12/421,231, filed on Apr. 9, 2009, now Pat. No. 8,154,281.

(60) Provisional application No. 61/045,638, filed on Apr. 17, 2008.

(51) Int. Cl.
*G01R 33/07*         (2006.01)

(52) U.S. Cl.
CPC .............. *G01R 33/07* (2013.01); *G01R 33/075* (2013.01)

(58) Field of Classification Search
CPC .... G01R 33/075; G01R 33/07; G01R 33/077; G01B 7/14; G01B 7/30; H01L 43/04; H01L 43/06; H01L 43/065
USPC ........................................................ 324/251
See application file for complete search history.

(56) References Cited

U.S. PATENT DOCUMENTS

| 5,406,202 | A |  | 4/1995 | Mahrgardt et al. |
| 5,604,433 | A |  | 2/1997 | Theus et al. |
| 5,621,319 | A |  | 4/1997 | Bilotti et al. |
| 6,064,202 | A | * | 5/2000 | Steiner ................ G01R 33/075 324/225 |

(Continued)

FOREIGN PATENT DOCUMENTS

| DE | 430 2342 A1 | 7/1993 |
| DE | 10 2006 059 421 A1 | 1/2008 |

OTHER PUBLICATIONS

"T:4 Dynamic Offset-Cancellation Techniques in CMOS", Kofi A.A. Makinwa, ISSCC, 2007 (38 pgs.).

(Continued)

*Primary Examiner* — Jay Patidar
(74) *Attorney, Agent, or Firm* — Dicke, Billig & Czaja, PLLC

(57) ABSTRACT

A spinning current Hall sensor configured to provide a sequence of input signals in response to a bias current being applied to a sequence of terminals of Hall sensing elements of the Hall sensor, the terminals of the Halls sensing elements configured to be interconnected in a sequence of configurations between a bias current supply and ground, with the bias current supply being connected to and applying the bias current to a different one of the terminals of each configuration. A chopping circuit demodulates the sequence of input signals to provide a corresponding sequence of demodulated positive and negative signals, with a residual offset calibration signal for the spinning current Hall sensor being based on the sequence of demodulated positive and negative signals.

17 Claims, 10 Drawing Sheets

(56) References Cited

U.S. PATENT DOCUMENTS

| | | |
|---|---|---|
| 7,605,647 B1 | 10/2009 | Romero et al. |
| 2007/0029999 A1 | 2/2007 | Middelhoek et al. |
| 2007/0114988 A1 | 5/2007 | Rossmann et al. |
| 2009/0315549 A1 | 12/2009 | Hackner et al. |
| 2011/0133723 A1 | 6/2011 | Forsyth et al. |
| 2012/0016614 A1* | 1/2012 | Hohe ................ G01R 33/0017 702/85 |

OTHER PUBLICATIONS

"A Chopped Hall Sensor with Programmable True Power-On Function", Mario Motz, et al., Infineon Technologies AG 2004, (4 pgs.).

"A Chopped Hall Sensor with Small Jitter and Programmable True Power-On Function", Mario Motz, IEEE 2005 (8 pgs.).

"A CMOS Nested-Chopper Instrumentation Amplifier with 100-nV Offest", Anton Bakker, et al., IEEE, 2000 (7 pgs.).

"A Fully Integrated CMOS Hall Sensor with a 3.65µ T 3o Offset for Compass Applications", Jeroen C. Van Der Meer, ISSCC 2005 (2 pgs.).

"An Integrated Hall Sensor Platform Design for Position, Angle and Current Sensing", Mario Motz, et al., Infineon Technologies AG, 2006 pp. 298-299 (2 pgs.).

"An Integrated Magnetic Sensor with Two Continuous-Time $\Delta\Sigma$-Converters and Stress Compensation Capability", Mario Motz, et al., IEEE 2006 (3 pgs.).

"Smart Sensor Design: The Art of Compensation and Cancellation", Kofi A.A. Makinwa, et al., IEEE, 2007 (7 pgs.).

* cited by examiner

SPINNING CURRENT HALL SENSOR WITH RESIDUAL OFFSET CALIBRATION SIGNAL

CROSS-REFERENCE TO RELATED APPLICATIONS

This Utility is a continuation application of U.S. patent application Ser. No. 13/443,099, filed on Apr. 10, 2012, which is a divisional of U.S. application Ser. No. 12/421,231, filed Apr. 9, 2009 and claims the benefit of Provisional Patent Application Ser. No. 61/045,638, filed Apr. 17, 2008, all of which are incorporated herein by reference.

BACKGROUND

Sensors based on the Hall-effect, referred to as Hall sensors, are widely used as magnetic field sensors. A Hall sensor includes one or more Hall-effect sensing elements that measure magnetic field strength and/or direction. These measurements are used to obtain parameters, such as distance, position, and rotational speed. However, Hall sensing elements exhibit offsets at their outputs due to mechanical stresses, doping, and geometrical errors. Also, Hall sensing elements exhibit offset drift, which results in an unpredictable and time-varying output error.

Offsets in Hall sensing elements can be reduced via the spinning current method, where the bias current of a Hall sensing element is spatially rotated around the Hall sensing element, while the output is averaged in time. This reduces offset and offset drift. Also, Hall sensor offset can be instantaneously reduced by orthogonally coupling two or more Hall sensing elements.

Input amplifiers receive and amplify the signals from the Hall sensing elements. These input amplifiers include noise and amplifier offsets. Dynamic offset-cancellation techniques, including auto zeroing and chopping techniques, can be used to reduce the noise and offset of the input amplifiers. However, these techniques produce residual offsets caused by demodulated switching peaks and/or imperfections in the amplifier circuit.

For these and other reasons there is a need for the present invention.

SUMMARY

One embodiment described in the disclosure provides a system including a spinning current Hall sensor and a chopping circuit. The spinning current Hall sensor is configured to provide input signals and the chopping circuit is configured to receive the input signals. Spinning phases of the spinning current Hall sensor are lengthened in residual offset adjustment phases to obtain signals that correspond to the residual offset voltages of the spinning phases.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
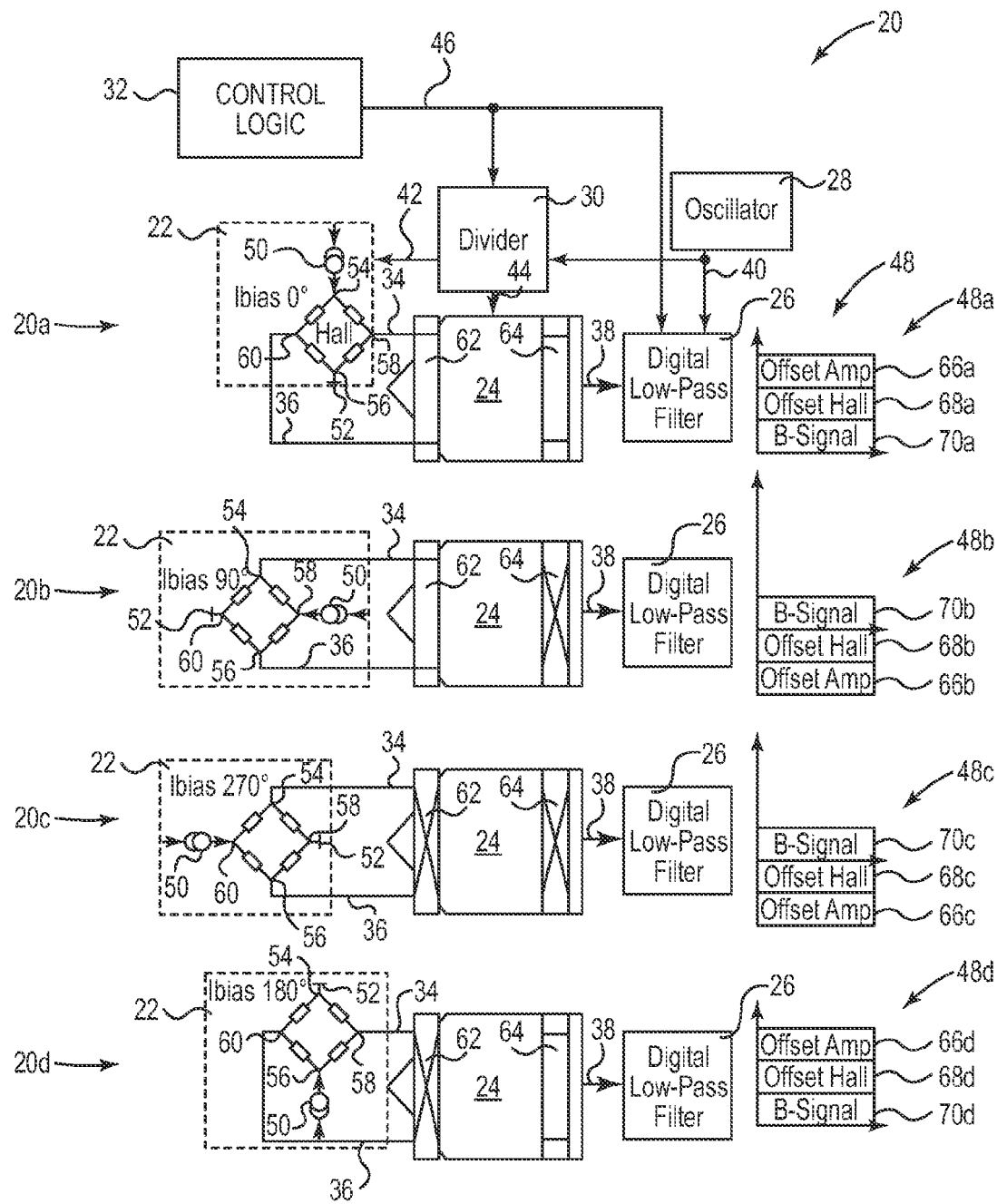
FIG. 1 is a diagram illustrating one embodiment of a sensor system.

FIG. 1 is a diagram illustrating one embodiment of a sensor system 20 that is a four-phase spinning current Hall sensor system. Sensor system 20 has two system phase types; operating phases and residual offset adjustment phases. Sensor system 20 spins or rotates through the four phases in the operating phases and in the residual offset adjustment phases of sensor system 20. The first phase of sensor system 20 is a 0 degree phase at 20a. The second phase of sensor system 20 is a 90 degree phase at 20b. The third phase of sensor system 20 is a 270 degree phase at 20c and the fourth phase of sensor system 20 is a 180 degree phase at 20d. Sensor system 20 spins in a sequence from the first phase at 20a, to the second phase at 20b, to the third phase at 20c, and to the fourth phase at 20d. The sequence then repeats, beginning with the first phase at 20a. In other embodiments, sensor system 20 has a different number of phases, such as two or eight or more phases.

Sensor system 20 includes a spinning current Hall sensor 22, a chopping circuit 24, a digital low pass filter 26, an oscillator 28, a clock divider 30, and control logic 32. Hall sensor 22 is electrically coupled to chopping circuit 24 via input signal paths 34 and 36. Chopping circuit 24 is electrically coupled to digital low pass filter 26 via chopped signal path 38. Oscillator 28 is electrically coupled to digital low pass filter 26 and clock divider 30 via clock path 40. Clock divider 30 is electrically coupled to spinning current Hall sensor 22 via spinning clock path 42 and to chopping circuit 24 via chopping clock path 44. Control logic 32 is electrically coupled to digital low pass filter 26 and clock divider 30 via control path 46.

In operating phases of sensor system 20, the spinning current Hall sensor 22 spins through each of the four phases at 20a-20d. A bias current flows through spinning current Hall sensor 22 at a different angle in each of the four phases at 20a-20d. Chopping circuit 24 is electrically coupled to different points on spinning current Hall sensor 22 in each of the four phases at 20a-20d and spinning current Hall sensor 22 provides input signals to chopping circuit 24 via input signal paths 34 and 36. Chopping circuit 24 receives the input signals at 34 and 36 and provides chopped output signals via chopped signal path 38. Digital low pass filter 26 receives the chopped output signals at 38 and provides output signals at 48.

In residual offset adjustment phases, each of the four phases at 20a-20d is lengthened to obtain signals that correspond to the residual offset of each of the phases. In one embodiment, the signals are summed to obtain an offset calibration signal that is used in the operating phases to calibrate the output signals at 48.

Oscillator 28 provides a clock signal to digital low pass filter 26 and clock divider 30 via clock path 40. Digital low pass filter 26 receives and is clocked via the clock signal at 40 to low pass filter the chopped output signals at 38. Clock divider 30 receives the clock signal at 40 and divides the clock signal to provide the spinning clock signal at 42 and the chopping clock signal at 44.

Control logic 32 controls the residual offset adjustment phases and operating phases of sensor system 20. Control logic 32 provides control signals to clock divider 30 and digital low pass filter 26 via control path 46. Control logic 32 provides a control signal, referred to as the offset adjustment signal, which switches sensor system 20 to the residual offset adjustment phases and back to the operating phases. In the residual offset adjustment phases, clock divider 30 receives the offset adjustment signal and divides the clock signal at 40 to provide a slower spinning clock signal, which lengthens each of the four phases 20a-20d to obtain signals that correspond to the residual offset of each of the phases. In one embodiment, the residual offset adjustment phases are activated between operating phases. In one embodiment, the residual offset adjustment phases are activated in production. In one embodiment, the residual offset adjustment phases are activated via an external circuit, such as a tester.

In the first phase at 20a, spinning current Hall sensor 22 receives a bias current via current source 50, which flows through spinning current Hall sensor 22 to a reference, such as ground, at 52. The bias current flows from the top at 54 to the bottom at 56 of spinning current Hall sensor 22, and the first phase at 20a is referred to as the 0 degree phase. The input paths 34 and 36 are electrically coupled to the right side at 58 and the left side at 60 of spinning current Hall sensor 22, respectively.

Chopping circuit 24 receives the input signals at 34 and 36 and, without crossing the inputs at 62 or the outputs at 64, chopping circuit 24 provides a chopped output signal at 38. Digital low pass filter 26 receives the chopped output signal at 38 and provides output signals at 48a. In the output signals at 48a, amplifier offsets at 66a, Hall sensor offsets at 68a, and magnetic field signals at 70a are all positive.

In the second phase at 20b, spinning current Hall sensor 22 receives the bias current via current source 50, which flows through spinning current Hall sensor 22 to the reference at 52. The bias current flows from the right side at 58 to the left side at 60, and the second phase at 20b is referred to as the 90 degree phase. The input paths 34 and 36 are electrically coupled to the top at 54 and the bottom at 56, respectively.

Chopping circuit 24 receives the input signals at 34 and 36. Chopping circuit 24 does not cross the inputs at 62, but crosses the outputs at 64 to provide the chopped output signal at 38. Digital low pass filter 26 receives the chopped output signal at 38 and provides output signals at 48b. In the output signals at 48b, amplifier offsets at 66b and Hall sensor offsets at 68b are negative and magnetic field signal values at 70b are positive.

In the third phase at 20c, spinning current Hall sensor 22 receives the bias current via current source 50, which flows through spinning current Hall sensor 22 to the reference at 52. The bias current flows from the left side at 60 to the right side at 58, and the third phase at 20c is referred to as the 270 degree phase. The input paths 34 and 36 are electrically coupled to the top at 54 and the bottom at 56, respectively.

Chopping circuit 24 receives the input signals at 34 and 36. Chopping circuit 24 crosses the inputs at 62 and the outputs at 64 to provide the chopped output signal at 38. Digital low pass filter 26 receives the chopped output signal at 38 and provides output signals at 48c. In the output signals at 48c, amplifier offsets at 66c and Hall sensor offsets at 68c are negative and magnetic field signal values at 70c are positive.

In the fourth phase at 20d, spinning current Hall sensor 22 receives the bias current via current source 50, which flows through spinning current Hall sensor 22 to the reference at 52. The bias current flows from the bottom at 56 to the top at 54, and the fourth phase at 20d is referred to as the 180 degree phase. The input paths 34 and 36 are electrically coupled to the right side at 58 and the left side at 60, respectively.

Chopping circuit 24 receives the input signals at 34 and 36. Chopping circuit 24 crosses the inputs at 62, but does not cross the outputs at 64 to provide the chopped output signal at 38. Digital low pass filter 26 receives the chopped output signal at 38 and provides output signals at 48d. In the output signals at 48d, amplifier offsets at 66d, Hall sensor offsets at 68d, and magnetic field signal values at 70d are positive.

If the output signals at 48 are summed, the amplifier offsets at 66 are summed to about zero and the Hall sensor offsets at 68 are summed to about zero. The magnetic field signal values at 70 are summed to a positive value that is the magnetic field signal.

In the residual offset adjustment phases, each of the four phases at 20a-20d is lengthened to obtain signals, such as balancing signals, which correspond to the residual offset of each of the phases. At least part of the residual offset is due to switching spikes or peaks from chopping circuit 22. In one embodiment, the signals and/or the residual offsets from all four phases 20a-20d are averaged to obtain an offset calibration signal that is an estimate of the residual offset for the operating phases. In one embodiment, the signals and/or the residual offsets from all four phases 20a-20d are summed to obtain an offset calibration signal that is used in the operating phases to calibrate the output signals at 48. In one embodiment, the signals and/or the offset calibration signals are stored in electrically erasable programmable read only memory (EEPROM) and used during operating phases.

In one embodiment, the residual offset adjustment phases are activated at a first temperature to obtain a first offset calibration value and at a second temperature to obtain a second offset calibration value. Subsequent offset calibration values are calculated from the first offset calibration value and the second offset calibration value based on the current temperature and the first temperature and the second temperature.

Figure 2:
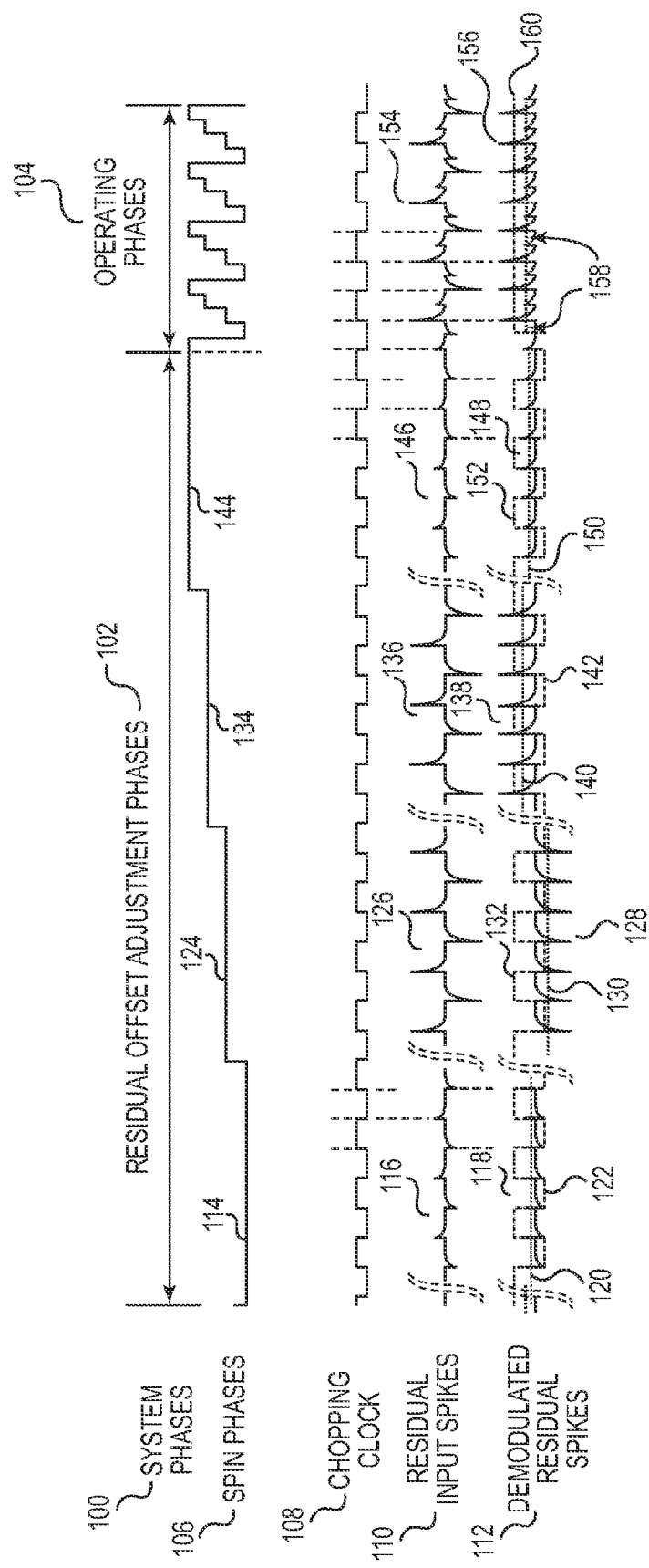
FIG. 2 is a timing diagram illustrating the operation of one embodiment of a sensor system.

FIG. 2 is a timing diagram illustrating the operation of one embodiment of sensor system 20. Sensor system 20 has two system phase types at 100; the residual offset adjustment phases at 102 and the operating phases at 104. Control logic 32 switches sensor system 20 from one system phase type to the other system phase type. In the residual offset adjustment phases at 102, each of the spin phases at 106 is lengthened to obtain signals that correspond to the residual offset voltage of each of the four phases 20a-20d. In the operating phases at 104, each of the spin phases at 106 is shortened and the spin phase frequency is increased to obtain magnetic field signal measurements.

The chopping clock at 108 is provided to chopping circuit 24 via clock divider 30 and chopping circuit 24 produces residual input spikes at 110 that are demodulated via chopping circuit 24 to provide demodulated residual spikes at 112.

In the residual offset adjustment phases at 102, chopping circuit 24 operates in the first phase at 114 to produce residual input spikes at 116 in the residual input spikes at 110. Chopping circuit 24 demodulates the residual input spikes at 116 to produce demodulated residual spikes at 118 and an average residual offset signal at 120. The demodulated residual spikes at 118 and the average residual offset signal at 120 are negative. The demodulated residual spikes at 118 are smaller than a hypothetical input signal at 122. Sensor system 20 obtains signals, such as balancing signals, which correspond to the residual offset signal at 120.

In the second phase at 124, chopping circuit 24 produces residual input spikes at 126 in the residual input spikes at 110. Chopping circuit 24 demodulates the residual input spikes at 126 to produce demodulated residual spikes at 128 and an average residual offset signal at 130. The demodulated residual spikes at 128 and the average residual offset signal at 130 are negative. The demodulated residual spikes at 128 are larger than the hypothetical input signal at 132. Sensor system 20 obtains signals, such as balancing signals, which correspond to the residual offset signal at 130.

In the third phase at 134, chopping circuit 24 produces residual input spikes at 136 in the residual input spikes at 110. Chopping circuit 24 demodulates the residual input spikes at 136 to produce demodulated residual spikes at 138 and an average residual offset signal at 140. The demodulated residual spikes at 138 and the average residual offset signal at 140 are positive. The demodulated residual spikes at 138 are larger than the hypothetical input signal at 142. Sensor system 20 obtains signals, such as balancing signals, which correspond to the residual offset signal at 140.

In the fourth phase at 144, chopping circuit 24 produces residual input spikes at 146 in the residual input spikes at 110. Chopping circuit 24 demodulates the residual input spikes at 146 to produce demodulated residual spikes at 148 and an average residual offset signal at 150. The demodulated residual spikes at 148 and the average residual offset signal at 150 are positive. The demodulated residual spikes at 148 are smaller than a hypothetical input signal at 152. Sensor system 20 obtains signals, such as balancing signals, which correspond to the residual offset signal at 150.

In one embodiment, the signals and/or the residual offsets from all four phases 20a-20d are averaged, via summing and averaging positive and negative values, to obtain an offset calibration signal that is an estimate of the residual offset for the operating phases at 104. In one embodiment, the signals and/or the residual offsets from all four phases 20a-20d are summed, via summing positive and negative values, to obtain an offset calibration signal that is used in the operating phases at 104 to calibrate the output signals at 48.

In the operating phases at 104, spin phases at 106 spin through the sequence of phases beginning with the first phase, to the second phase, to the third phase, and then to the fourth phase. The sequence is then repeated. Chopping circuit 24 operates in the operating phases at 104 to produce residual input spikes at 154 in the residual input spikes at 110. Chopping circuit 24 demodulates the residual input spikes at 154 to produce demodulated residual spikes at 156 and an average residual offset signal at 158. The demodulated residual spikes at 156 and the average residual offset signal at 158 are positive. The demodulated residual spikes at 156 are larger and smaller than the input signal at 160. The offset calibration signal obtained via the residual offset adjustment phases at 102 is added to the average residual offset signal at 158 to provide a calibrated magnetic field output signal at 48.

Figure 3:
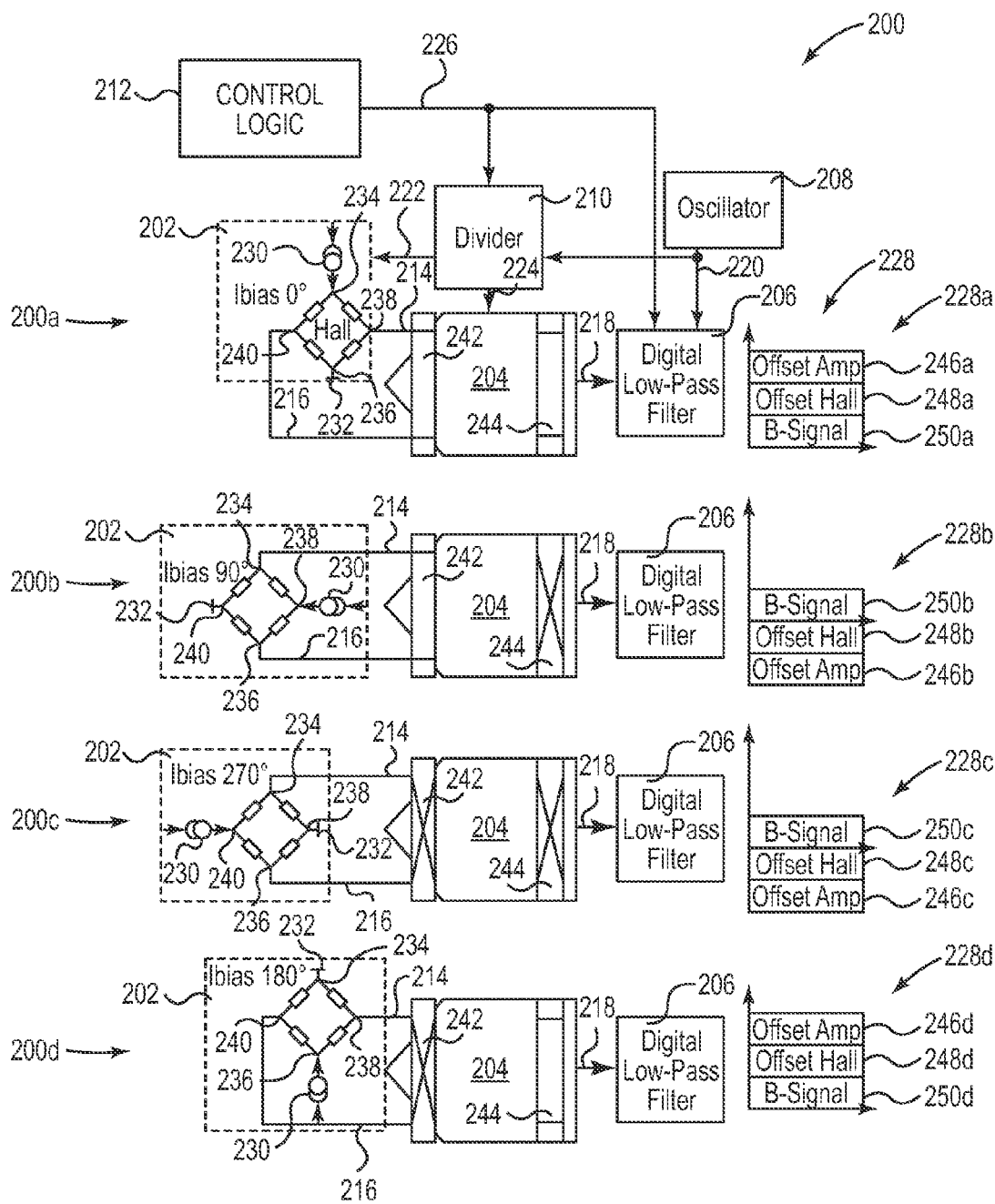
FIG. 3 is a diagram illustrating one embodiment of a sensor system that determines an offset calibration signal via two chopping frequencies.

FIG. 3 is a diagram illustrating one embodiment of a sensor system 200 that determines an offset calibration signal via two chopping frequencies. Sensor system 200 is a four-phase spinning current Hall sensor system, having a first phase that is a 0 degree phase at 200a, a second phase that is a 90 degree phase at 200b, a third phase that is a 270 degree phase at 200c, and a fourth phase that is a 180 degree phase at 200d. Sensor system 200 spins in a sequence from the first phase at 200a, to the second phase at 200b, to the third phase at 200c, and to the fourth phase at 200d. The sequence then repeats, beginning with the first phase at 200a. In other embodiments, sensor system 200 has a different number of phases, such as two or eight or more phases.

Sensor system 200 includes a spinning current Hall sensor 202, a chopping circuit 204, a digital low pass filter 206, an oscillator 208, a clock divider 210, and control logic 212. Hall sensor 202 is electrically coupled to chopping circuit 204 via input signal paths 214 and 216. Chopping circuit 204 is electrically coupled to digital low pass filter 206 via chopped signal path 218. Oscillator 208 is electrically coupled to digital low pass filter 206 and clock divider 210 via clock path 220. Clock divider 210 is electrically coupled to spinning current Hall sensor 202 via spinning clock path 222 and to chopping circuit 204 via chopping clock path 224. Control logic 212 is electrically coupled to digital low pass filter 206 and clock divider 210 via control path 226.

In operation, the spinning current Hall sensor 202 spins through each of the four phases at 200a-200d. A bias current flows through spinning current Hall sensor 202 at a different angle in each of the four phases at 200a-200d and chopping circuit 204 is electrically coupled to different points on spinning current Hall sensor 202 in each of the four phases at 200a-200d. Spinning current Hall sensor 202 provides input signals to chopping circuit 204 via input signal paths 214 and 216. Chopping circuit 204 receives the input signals at 214 and 216 and a chopping clock signal at 224 and provides chopped output signals via chopped signal path 218. Digital low pass filter 206 receives the chopped output signals at 218 and provides filtered output signals at 228 that are adjusted via the offset calibration signal.

To obtain the offset calibration signal, chopping circuit 204 receives the chopping clock signal at 224 at a first chopping frequency and a first residual offset signal is obtained at the first chopping frequency. Also, chopping circuit 204 receives the chopping clock signal at 224 at a second chopping frequency and a second residual offset signal is obtained at the second chopping frequency. The difference between the first residual offset signal and the second residual offset signal is used to determine the offset calibration signal.

In one embodiment, the first chopping frequency is twice the second chopping frequency. In operation at the second chopping frequency, the difference between the first residual offset signal and the second residual offset signal is the offset calibration signal, which is deducted from the output signals at 228. In operation at the first chopping frequency, twice the difference between the first residual offset signal and the second residual offset signal is deducted from the output signals at 228.

The chopping frequency is switched back and forth between the first chopping frequency and the second chopping frequency at a slow rate, such that the input signal is not affected by switching the chopping frequency between the first and second chopping frequencies.

Oscillator 208 provides a clock signal to digital low pass filter 206 and clock divider 210 via clock path 220. Digital low pass filter 206 receives and is clocked via the clock signal at 220 to low pass filter the chopped output signals at 218. Clock divider 210 receives the clock signal at 220 and divides the clock signal to provide the spinning clock signal at 222 and the chopping clock signal at 224.

Control logic 212 controls sensor system 200. Control logic 212 provides control signals to clock divider 210 and digital low pass filter 206 via control path 226. Control logic 212 provides a control signal, referred to as a chopping speed signal, which changes the frequency of the chopping clock signal at 224. Clock divider 210 receives the chopping speed signal at 226 and provides the chopping clock signal at 224 at a first chopping frequency or a second chopping frequency. In one embodiment, the residual offset calibration signal is obtained during normal operations. In one embodiment, the residual offset calibration signal is obtained between normal operations. In one embodiment, the residual offset calibration signal is obtained in production. In one embodiment, the chopping speed signal is provided via an external circuit, such as a tester.

In the first phase at 200a, spinning current Hall sensor 202 receives a bias current via current source 230, which flows through spinning current Hall sensor 202 to a reference, such as ground, at 232. The bias current flows from the top at 234 to the bottom at 236 of spinning current Hall sensor 202, and the first phase at 200a is referred to as the 0 degree phase. The input paths 214 and 216 are electrically coupled to the right side at 238 and the left side at 240 of spinning current Hall sensor 202, respectively.

Chopping circuit 204 receives the input signals at 214 and 216 and, without crossing the inputs at 242 or the outputs at 244, chopping circuit 204 provides a chopped output signal at 218. Digital low pass filter 206 receives the chopped output signal at 218 and provides output signals at 228a. In the output signals at 228a, amplifier offsets at 246a, Hall sensor offsets at 248a, and magnetic field signals at 250a are all positive.

In the second phase at 200b, spinning current Hall sensor 202 receives the bias current via current source 230, which flows through spinning current Hall sensor 202 to the reference at 232. The bias current flows from the right side at 238 to the left side at 240, and the second phase at 200b is referred to as the 90 degree phase. The input paths 214 and 216 are electrically coupled to the top at 234 and the bottom at 236, respectively.

Chopping circuit 204 receives the input signals at 214 and 216. Chopping circuit 204 does not cross the inputs at 242, but crosses the outputs at 244 to provide the chopped output signal at 218. Digital low pass filter 206 receives the chopped output signal at 218 and provides output signals at 228b. In the output signals at 228b, amplifier offsets at 246b and Hall sensor offsets at 248b are negative and magnetic field signal values at 250b are positive.

In the third phase at 200c, spinning current Hall sensor 202 receives the bias current via current source 230, which flows through spinning current Hall sensor 202 to the reference at 232. The bias current flows from the left side at 240 to the right side at 238, and the third phase at 200c is referred to as the 270 degree phase. The input paths 214 and 216 are electrically coupled to the top at 234 and the bottom at 236, respectively.

Chopping circuit 204 receives the input signals at 214 and 216. Chopping circuit 204 crosses the inputs at 242 and the outputs at 244 to provide the chopped output signal at 218. Digital low pass filter 206 receives the chopped output signal at 218 and provides output signals at 228c. In the output signals at 228c, amplifier offsets at 246c and Hall sensor offsets at 248c are negative and magnetic field signal values at 250c are positive.

In the fourth phase at 200d, spinning current Hall sensor 202 receives the bias current via current source 230, which flows through spinning current Hall sensor 202 to the reference at 232. The bias current flows from the bottom at 236 to the top at 234, and the fourth phase at 200d is referred to as the 180 degree phase. The input paths 214 and 216 are electrically coupled to the right side at 238 and the left side at 240, respectively.

Chopping circuit 204 receives the input signals at 214 and 216. Chopping circuit 204 crosses the inputs at 242, but does not cross the outputs at 244 to provide the chopped output signal at 218. Digital low pass filter 206 receives the chopped output signal at 218 and provides output signals at 228d. In the output signals at 228d, amplifier offsets at 246d, Hall sensor offsets at 248d, and magnetic field signal values at 250d are positive.

If the output signals at 228 are summed, the amplifier offsets at 246 are summed to about zero and the Hall sensor offsets at 248 are summed to about zero. The magnetic field signal values at 250 are summed to a positive value that is the magnetic field signal.

To obtain the residual offset calibration signal, chopping circuit 202 operates at a first chopping frequency to obtain a first residual offset signal. Where, at least part of the residual offset signal is due to switching spikes or peaks from chopping circuit 202. Next, chopping circuit 202 operates at a second chopping frequency to obtain a second residual offset signal. The difference between the first residual offset signal and the second residual offset signal is used to determine an offset calibration signal. In one embodiment, the offset calibration signal is stored in EEPROM and used during normal mode operations.

In one embodiment, the first chopping frequency is twice the second chopping frequency. In operation at the second chopping frequency, the difference between the first residual offset signal and the second residual offset signal is the offset calibration signal, which is deducted from the output signals at 228. In operation at the first chopping frequency, twice the offset calibration signal is deducted from the output signals at 228.

In one embodiment, a first residual offset calibration signal is obtained at a first temperature and a second residual offset calibration signal is obtained at a second temperature. Subsequent offset calibration signals are calculated from the first offset calibration signal and the second offset calibration signal based on the current temperature and the first temperature and the second temperature.

Figure 4:
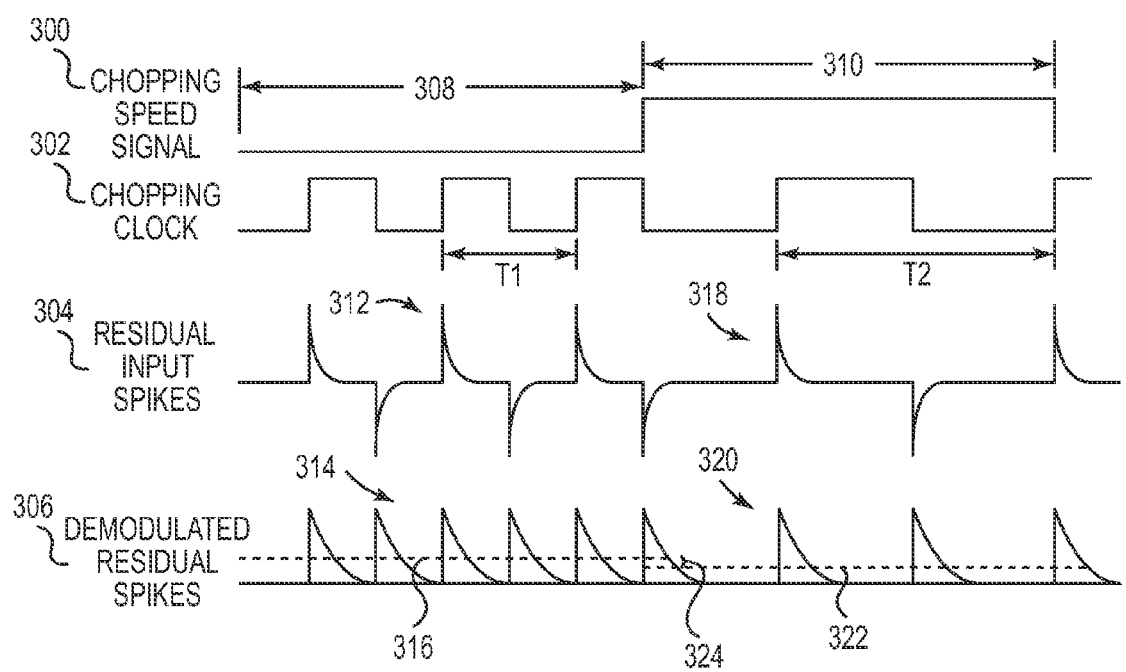
FIG. 4 is a timing diagram illustrating the operation of the sensor system of FIG. 3.

FIG. 4 is a timing diagram illustrating the operation of one embodiment of sensor system 200. Clock divider 210 receives the chopping speed signal at 300 from control logic 212 and provides the chopping clock signal at 302. Chopping circuit 204 receives the chopping clock signal at 302 and produces the residual input spikes at 304, which are demodulated via chopping circuit 204 to provide demodulated residual spikes at 306.

Sensor system 200 operates at two or more frequencies. Control logic 212 provides the chopping speed signal at 300 to switch the chopping clock signal frequency between the first chopping frequency at 308 and the second chopping frequency at 310. In one embodiment, the first chopping frequency at 308 is twice the second chopping frequency at 310.

At the first chopping frequency at 308, the chopping clock signal at 302 has a first period T1 and, at 312, two residual input spikes are produced per period T1 in the residual input spikes at 304. The residual input spikes at 312 are demodulated via chopping circuit 204 to produce the demodulated residual spikes at 314 and the first offset signal at 316.

At the second chopping frequency at 310, the chopping clock signal at 302 has a second period T2 and, at 318, two residual input spikes are produced per period T2. The residual input spikes at 318 are demodulated via chopping circuit 204 to produce the demodulated residual spikes at 320 and the second offset signal at 322. Second period T2 is longer than first period T1 and a larger number of residual input spikes are produced at the first chopping frequency at 308 over the same amount of time. Thus, the first offset signal at 316 is larger than the second offset signal at 322 due to the number of residual input spikes produced over the same time. The difference at 324 between the first offset signal at 316 and the second offset signal at 322 is used to determine the offset calibration signal.

In one embodiment, the first chopping frequency at 308 is twice the second chopping frequency at 310. In operation at the second chopping frequency at 310, the difference at 324 between the first offset signal at 316 and the second offset signal at 322 is the offset calibration signal, which is deducted from the output signals at 228. In operation at the first chopping frequency at 308, twice the difference at 324 is deducted from the output signals at 228.

Figure 5:
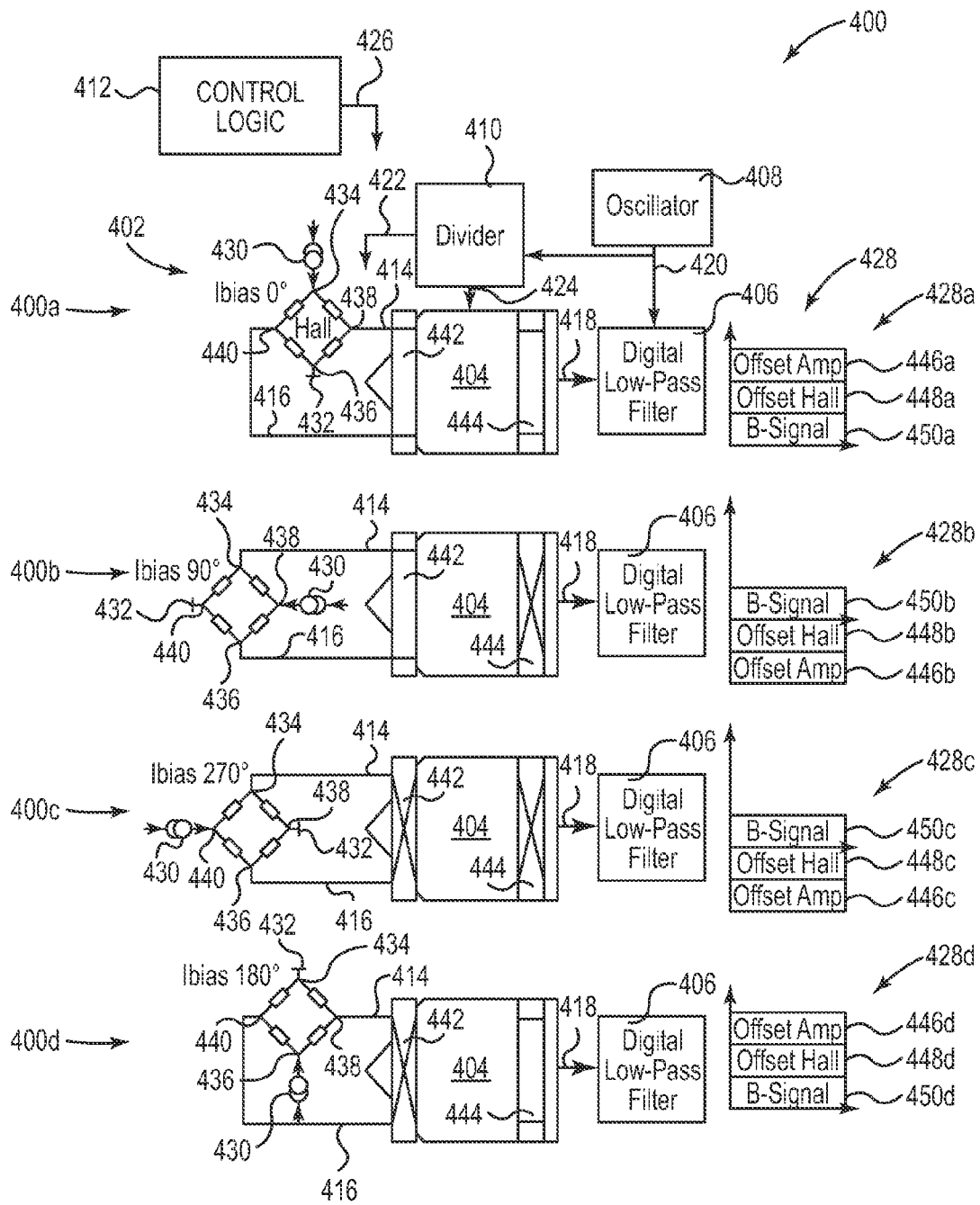
FIG. 5 is a diagram illustrating a sensor system and a first sequence of four phases.
Figure 6:
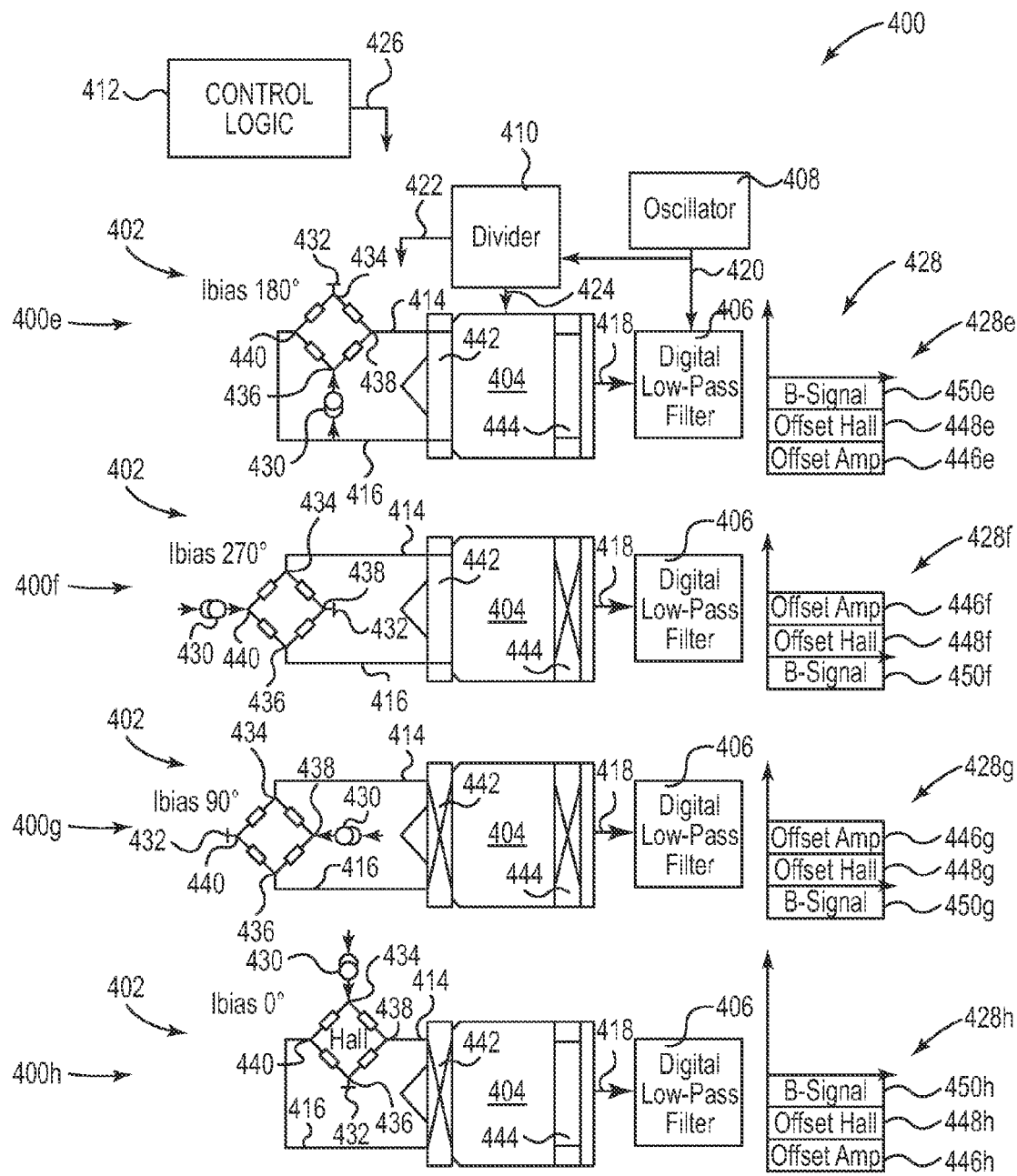
FIG. 6 is a diagram illustrating a sensor system and a second sequence of four phases.

FIGS. 5 and 6 are diagrams illustrating one embodiment of a sensor system 400 that determines a residual offset calibration signal via positive and negative input signals from a spinning current Hall sensor 402. Sensor system 400 is a four-phase spinning current Hall sensor system. In other embodiments, sensor system 400 has a different number of phases, such as two or eight or more phases.

Sensor system 400 includes spinning current Hall sensor 402, chopping circuit 404, digital low pass filter 406, oscillator 408, clock divider 410, and control logic 412. Hall sensor 402 is electrically coupled to chopping circuit 404 via input signal paths 414 and 416. Chopping circuit 404 is electrically coupled to digital low pass filter 406 via chopped signal path 418. Oscillator 408 is electrically coupled to digital low pass filter 406 and clock divider 410 via clock path 420. Clock divider 410 is electrically coupled to spinning current Hall sensor 402 via spinning clock path 422 and to chopping circuit 404 via chopping clock path 424. Control logic 412 is electrically coupled to Hall sensor 402 and other circuits via control path 426.

In normal mode, Hall sensor 402 spins through a sequence of four phases and provides either positive input signals or negative input signals. Chopping circuit receives the input signals and provides a chopped output signal to digital low pass filter 406 via chopped signal path 418. Digital low pass filter 406 receives the chopped output signal at 418 and provides output signals at 428. Digital low pass filter provides positive output signals that correspond to the positive input signals or negative output signals that correspond to the negative input signals.

In residual offset calibration mode, Hall sensor 402 spins through a first sequence of four phases and provides positive input signals and a second sequence of four phases and provides negative input signals. Chopping circuit 404 receives the positive input signals and the negative input signals and provides chopped output signals to digital low pass filter 406 via chopped signal path 418. Digital low pass filter 406 provides the output signals at 428, where positive output signals correspond to the positive input signals and negative output signals correspond to the negative input signals. A residual offset calibration signal is determined via the positive output signals and the negative output signals. In one embodiment, an accumulator sums the positive output signals and the negative output signals to obtain the residual offset calibration signal, where the residual offset calibration signal is used in normal mode to calibrate the output signals 428.

Oscillator 408 provides a clock signal to digital low pass filter 406 and clock divider 410 via clock path 420. Digital low pass filter 406 receives and is clocked via the clock signal at 420 to low pass filter the chopped output signals at 418. Clock divider 410 receives the clock signal at 420 and divides the clock signal to provide the spinning clock signal at 422 and the chopping clock signal at 424.

Control logic 412 controls the normal mode and the residual offset calibration mode of sensor system 400. Control logic 412 provides control signals to spinning current Hall sensor 402 and other circuits via control path 426. Control logic 412 provides a control signal, referred to as the invert bias current signal, which inverts the bias current through Hall sensor 402 or the spin direction of Hall sensor 402. In the residual offset calibration mode, control logic 412 controls Hall sensor 402 to provide positive input signals and negative input signals to chopping circuit 404. In one embodiment, the residual offset calibration mode is activated in normal mode operations. In one embodiment, the residual offset calibration mode is activated between normal mode operations. In one embodiment, the residual offset calibration mode is activated in production. In one embodiment, the residual offset calibration mode is activated via an external circuit, such as a tester.

In one embodiment, the residual offset calibration mode is activated at a first temperature to obtain a first offset calibration value and at a second temperature to obtain a second offset calibration value. Subsequent offset calibration values are calculated from the first offset calibration value and the second offset calibration value based on the current temperature and the first temperature and the second temperature.

FIG. 5 is a diagram illustrating sensor system 400 and a first sequence of four phases 400a-400d. Sensor system 400 spins through the first sequence in residual offset calibration mode. Also, in one embodiment, sensor system 400 spins through the first sequence in normal mode.

The first phase is a 0 degree phase at 400a, the second phase is a 90 degree phase at 400b, the third phase is a 270 degree phase at 400c, and the fourth phase is a 180 degree phase at 400d. Sensor system 400 spins in the first sequence from the first phase at 400a, to the second phase at 400b, to the third phase at 400c, and to the fourth phase at 400d. The sequence can then be repeated, beginning with the first phase at 400a.

In the first phase at 400a, spinning current Hall sensor 402 receives a bias current via current source 430, which flows through spinning current Hall sensor 402 to a reference, such as ground, at 432. The bias current flows from the top at 434 to the bottom at 436 of spinning current Hall sensor 402, and the first phase at 400*a* is referred to as a 0 degree phase. The input paths 414 and 416 are electrically coupled to the right side at 438 and the left side at 440 of spinning current Hall sensor 402, respectively.

Chopping circuit 404 receives the input signals at 414 and 416 and, without crossing the inputs at 442 or the outputs at 444, chopping circuit 404 provides a chopped output signal at 418. Digital low pass filter 406 receives the chopped output signal at 418 and provides output signals at 428*a*. In the output signals at 428*a*, amplifier offsets at 446*a*, Hall sensor offsets at 448*a*, and magnetic field signals at 450*a* are all positive.

In the second phase at 400*b*, spinning current Hall sensor 402 receives the bias current via current source 430, which flows through spinning current Hall sensor 402 to the reference at 432. The bias current flows from the right side at 438 to the left side at 440, and the second phase at 400*b* is referred to as a 90 degree phase. The input paths 414 and 416 are electrically coupled to the top at 434 and the bottom at 436, respectively.

Chopping circuit 404 receives the input signals at 414 and 416. Chopping circuit 404 does not cross the inputs at 442, but crosses the outputs at 444 to provide the chopped output signal at 418. Digital low pass filter 406 receives the chopped output signal at 418 and provides output signals at 428*b*. In the output signals at 428*b*, amplifier offsets at 446*b* and Hall sensor offsets at 448*b* are negative and magnetic field signal values at 450*b* are positive.

In the third phase at 400*c*, spinning current Hall sensor 402 receives the bias current via current source 430, which flows through spinning current Hall sensor 402 to the reference at 432. The bias current flows from the left side at 440 to the right side at 438, and the third phase at 400*c* is referred to as a 270 degree phase. The input paths 414 and 416 are electrically coupled to the top at 434 and the bottom at 436, respectively.

Chopping circuit 404 receives the input signals at 414 and 416. Chopping circuit 404 crosses the inputs at 442 and the outputs at 444 to provide the chopped output signal at 418. Digital low pass filter 406 receives the chopped output signal at 418 and provides output signals at 428*c*. In the output signals at 428*c*, amplifier offsets at 446*c* and Hall sensor offsets at 448*c* are negative and magnetic field signal values at 450*c* are positive.

In the fourth phase at 400*d*, spinning current Hall sensor 402 receives the bias current via current source 430, which flows through spinning current Hall sensor 402 to the reference at 432. The bias current flows from the bottom at 436 to the top at 434, and the fourth phase at 400*d* is referred to as a 180 degree phase. The input paths 414 and 416 are electrically coupled to the right side at 438 and the left side at 440, respectively.

Chopping circuit 404 receives the input signals at 414 and 416. Chopping circuit 404 crosses the inputs at 442, but does not cross the outputs at 444 to provide the chopped output signal at 418. Digital low pass filter 406 receives the chopped output signal at 418 and provides output signals at 428*d*. In the output signals at 428*d*, amplifier offsets at 446*d*, Hall sensor offsets at 448*d*, and magnetic field signal values at 450*d* are positive.

If the output signals at 428*a*-428*d* are summed, the amplifier offsets at 446*a*-446*d* are summed to about zero and the Hall sensor offsets at 448*a*-448*d* are summed to about zero. The magnetic field signal values at 450*a*-450*d* are summed to a positive signal value.

FIG. 6 is a diagram illustrating sensor system 400 and a second sequence of four phases 400*e*-400*h*. Sensor system 400 spins through the second sequence in residual offset calibration mode. Also, in one embodiment, sensor system 400 spins through the second sequence in normal mode.

The first phase is a 180 degree phase at 400*e*, the second phase is a 270 degree phase at 400*f*, the third phase is a 90 degree phase at 400*g*, and the fourth phase is a 0 degree phase at 400*h*. Sensor system 400 spins in the second sequence from the first phase at 400*e*, to the second phase at 400*f*, to the third phase at 400*g*, and to the fourth phase at 400*h*. The sequence can then be repeated, beginning with the first phase at 400*e*.

In the first phase at 400*e*, spinning current Hall sensor 402 receives a bias current via current source 430, which flows through spinning current Hall sensor 402 to a reference, such as ground, at 432. The bias current flows from the bottom at 436 to the top at 434 of spinning current Hall sensor 402, and the first phase at 400*e* is referred to as a 180 degree phase. The input paths 414 and 416 are electrically coupled to the right side at 438 and the left side at 440 of spinning current Hall sensor 402, respectively.

Chopping circuit 404 receives the input signals at 414 and 416 and, without crossing the inputs at 442 or the outputs at 444, chopping circuit 404 provides a chopped output signal at 418. Digital low pass filter 406 receives the chopped output signal at 418 and provides output signals at 428*e*. In the output signals at 428*e*, amplifier offsets at 446*e*, Hall sensor offsets at 448*e*, and magnetic field signals at 450*e* are all negative.

In the second phase at 400*f*, spinning current Hall sensor 402 receives the bias current via current source 430, which flows through spinning current Hall sensor 402 to the reference at 432. The bias current flows from the left side at 440 to the right side at 438, and the second phase at 400*f* is referred to as a 270 degree phase. The input paths 414 and 416 are electrically coupled to the top at 434 and the bottom at 436, respectively.

Chopping circuit 404 receives the input signals at 414 and 416. Chopping circuit 404 does not cross the inputs at 442, but crosses the outputs at 444 to provide the chopped output signal at 418. Digital low pass filter 406 receives the chopped output signal at 418 and provides output signals at 428*f*. In the output signals at 428*f*, amplifier offsets at 446*f* and Hall sensor offsets at 448*f* are positive and magnetic field signal values at 450*f* are negative.

In the third phase at 400*g*, spinning current Hall sensor 402 receives the bias current via current source 430, which flows through spinning current Hall sensor 402 to the reference at 432. The bias current flows from the right side at 438 to the left side at 440, and the third phase at 400*g* is referred to as a 90 degree phase. The input paths 414 and 416 are electrically coupled to the top at 434 and the bottom at 436, respectively.

Chopping circuit 404 receives the input signals at 414 and 416. Chopping circuit 404 crosses the inputs at 442 and the outputs at 444 to provide the chopped output signal at 418. Digital low pass filter 406 receives the chopped output signal at 418 and provides output signals at 428*g*. In the output signals at 428*g*, amplifier offsets at 446*g* and Hall sensor offsets at 448*g* are positive and magnetic field signal values at 450*g* are negative.

In the fourth phase at 400*h*, spinning current Hall sensor 402 receives the bias current via current source 430, which flows through spinning current Hall sensor 402 to the reference at 432. The bias current flows from the top at 434 to the bottom at 436, and the fourth phase at 400*h* is referred to as a 0 degree phase. The input paths 414 and 416 are electrically coupled to the right side at 438 and the left side at 440, respectively.

Chopping circuit 404 receives the input signals at 414 and 416. Chopping circuit 404 crosses the inputs at 442, but does not cross the outputs at 444 to provide the chopped output signal at 418. Digital low pass filter 406 receives the chopped output signal at 418 and provides output signals at 428h. In the output signals at 428h, amplifier offsets at 446h, Hall sensor offsets at 448h, and magnetic field signal values at 450h are negative.

If the output signals at 428e-428h are summed, the amplifier offsets at 446e-446h are summed to about zero and the Hall sensor offsets at 448e-448h are summed to about zero. The magnetic field signal values at 450e-450h are summed to a negative signal value.

In the residual offset calibration mode, sensor system 400 spins through the first sequence of four phases 400a-400d and the second sequence of four phases 400e-400h. Summing the output signals 428a-428h, such as via an accumulator, results in a signal that is the residual offset that is used for the residual offset calibration value. In one embodiment, the offset calibration signal(s) are stored in EEPROM and used during normal mode operations.

Figure 7:
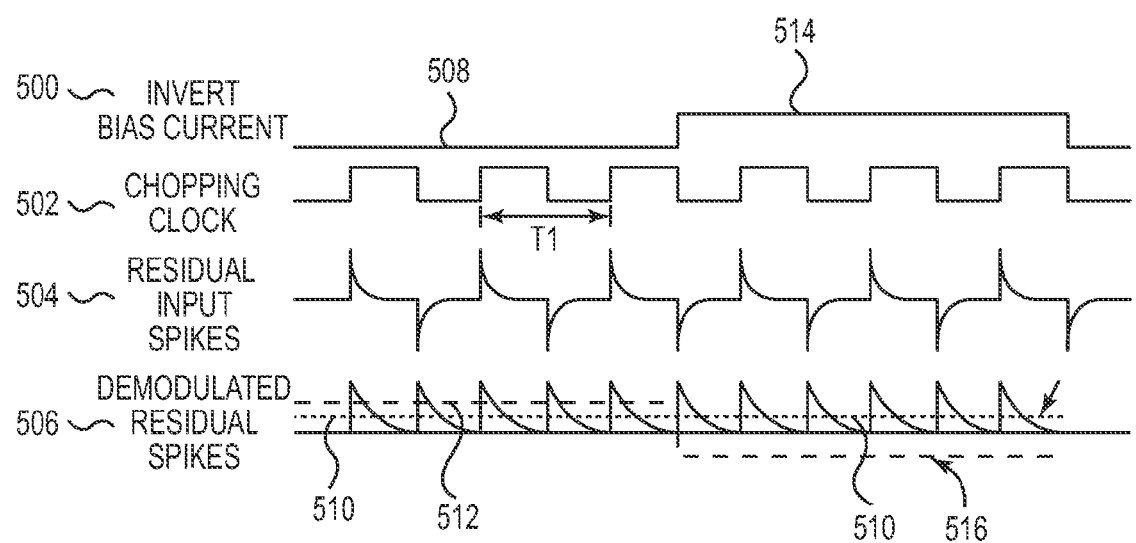
FIG. 7 is a timing diagram illustrating the operation of one embodiment of the sensor system of FIGS. 5 and 6.

FIG. 7 is a timing diagram illustrating the operation of one embodiment of sensor system 400. In the residual offset calibration mode, control logic 412 controls Hall sensor 402 to provide positive input signals and negative input signals to chopping circuit 404. Hall sensor 402 receives the invert bias current signal at 500 from control logic 412 and inverts the bias current through Hall sensor 402 or the spin direction of Hall sensor 402 based on the invert bias current signal at 500.

Clock divider 410 receives the clock signal at 420 and divides the clock signal to provide the chopping clock signal at 502. Chopping circuit 404 receives the chopping clock signal at 502 and produces the residual input spikes at 504, which are demodulated via chopping circuit 404 to provide demodulated residual spikes at 506.

Sensor system 400 provides positive input signals and negative input signals in residual offset calibration mode. Digital low pass filter 406 provides the output signals at 428, where positive output signals correspond to the positive input signals and negative output signals correspond to the negative input signals. A residual offset calibration signal is determined via the positive output signals and the negative output signals.

In operation, control logic 412 provides a low invert bias current signal at 508 and Hall sensor 402 receives the low invert bias current signal at 508 and provides positive input signals. Chopping circuit 404 receives the chopping clock signal at 502, which has a period T1, and provides two residual input spikes at 504 per clock period T1. Chopping circuit 404 provides the demodulated residual spikes at 506, which produces the residual offset signal at 510. Digital low pass filter provides the positive output signal at 512, which corresponds to the positive input signals from Hall sensor 402.

Next, control logic 412 provides a high invert bias current signal at 514 and Hall sensor 402 receives the high invert bias current signal at 514 and provides negative input signals. Chopping circuit 404 receives the chopping clock signal at 502 and provides two residual input spikes at 504 per clock period T1. Also, chopping circuit 404 provides the demodulated residual spikes at 506, which produces the residual offset signal at 510. Digital low pass filter provides the negative output signal at 516, which corresponds to the negative input signals from Hall sensor 402.

A residual offset calibration signal is determined via the residual offset signal at 510 and the positive and negative output signals at 512 and 516. In one embodiment, an accumulator sums the residual offset signal at 510 and the positive and negative output signals at 512 and 516 to obtain the residual offset calibration signal, where the residual offset calibration signal is used in normal mode to calibrate the output signals 428.

Figure 8:
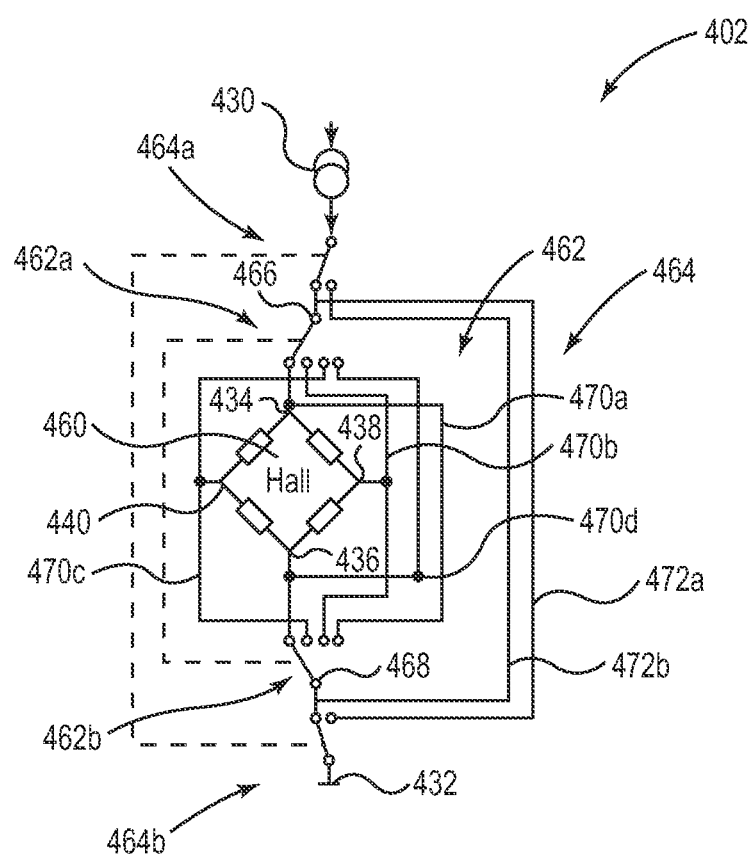
FIG. 8 is a diagram illustrating one embodiment of a spinning current Hall sensor.

FIG. 8 is a diagram illustrating one embodiment of a spinning current Hall sensor 402 that provides positive input signals via a bias current and negative input signals via inverting the bias current. Hall sensor 402 includes current source 430, reference 432, a Hall sensing element 460, a spinning circuit 462, and a bias current supply circuit 464.

Spinning circuit 462 includes a top spin switch 462a, a bottom spin switch 462b, and four output paths 470a-470d. Top spin switch 462a includes input 466 and bottom spin switch includes input 468. The first output path 470a is electrically coupled to the top at 434 of Hall sensing element 460, the second output path 470b is electrically coupled to the right side at 438 of Hall sensing element 460, the third output path 470c is electrically coupled to the left side at 440 of Hall sensing element 460, and the fourth output path 470d is electrically coupled to the bottom at 436 of Hall sensing element 460.

Top spin switch 462a and bottom spin switch 462b are electrically coupled to the four output paths 470a-470d. A first output of top spin switch 462a is electrically coupled to a fourth output of second spin switch 462b via first output path 470a. A second output of top spin switch 462a is electrically coupled to a third output of second spin switch 462b via second output path 470b. A third output of top spin switch 462a is electrically coupled to a second output of second spin switch 462b via third output path 470c, and a fourth output of top spin switch 462a is electrically coupled to a first output of second spin switch 462b via fourth output path 470d.

Bias current supply circuit 464 includes a top bias current switch 464a, a bottom bias current switch 464b, and two bias current paths 472a and 472b. One end of top bias current switch 464a is electrically coupled to current source 430 and one end of bottom bias current switch 464b is electrically coupled to reference 432. Top bias current switch 464a and bottom bias current switch 464b are electrically coupled to the two bias current paths 472a and 472b. A first output of top bias current switch 464a is electrically coupled to a second output of bottom bias current switch 464b via bias current path 472a. A second output of top bias current switch 464b is electrically coupled to a first output of bottom bias current switch 464b via bias current path 472b.

In operation, control logic 412 controls top and bottom bias current switches 464a and 464b to provide a bias current for positive input signals and an inverted bias current for negative input signals. The result is two spin sequences. Positive input signals are provided via a first spin sequence that begins with a 0 degree phase, to a 90 degree phase, to a 270 degree phase, to a 180 degree phase as shown in FIG. 5. Negative input signals are provided via a second spin sequence that begins with a 180 degree phase, to a 270 degree phase, to a 90 degree phase, to a 0 degree phase as shown in FIG. 6.

To provide a bias current and the first spin sequence, top and bottom bias current switches 464a and 464b are switched to the left, such that top bias current switch 464a provides current from current source 430 to the input of top spin switch 462a and bottom bias current switch 464b connects the input of bottom spin switch 462b to the reference at 432.

Spinning circuit 462 spins the top spin switch 462a and the bottom spin switch 462b from left to right, such that the bias current rotates in the spin sequence from the 0 degree phase, to the 90 degree phase, to the 270 degree phase, to the 180 degree phase. Where, in the 0 degree phase, the bias current flows from the top at 434 to the bottom at 436 of Hall sensing element 460. In the 90 degree phase, the bias current flows from the right side at 438 to the left side at 440 of Hall sensing element 460. In the 270 degree phase, the bias current flows from the left side at 440 to the right side at 438 of Hall sensing element 460, and in the 180 degree phase, the bias current flows from the bottom at 436 to the top at 434 of Hall sensing element 460.

To provide an inverted bias current and the second spin sequence, top and bottom bias current switches 464a and 464b are switched to the right, such that top bias current switch 464a provides current from current source 430 to the input of bottom spin switch 462b and bottom bias current switch 464b connects the input of top spin switch 462a to the reference at 432.

Spinning circuit 462 spins the top spin switch 462a and the bottom spin switch 462b from left to right, such that the bias current rotates in the spin sequence from the 180 degree phase, to the 270 degree phase, to the 90 degree phase, to the 0 degree phase. In the 180 degree phase, the bias current flows from the bottom at 436 to the top at 434. In the 270 degree phase, the bias current flows from the left side at 440 to the right side at 438. In the 90 degree phase, the bias current flows from the right side at 438 to the left side at 440. In the 0 degree phase, the bias current flows from the top at 434 to the bottom at 436.

Figure 9A:
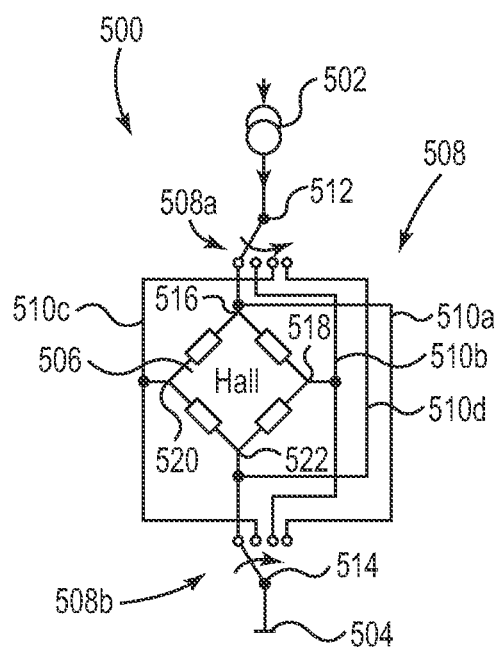
FIG. 9A is a diagram illustrating a spinning current Hall sensor spinning in a first spin direction.
Figure 9B:
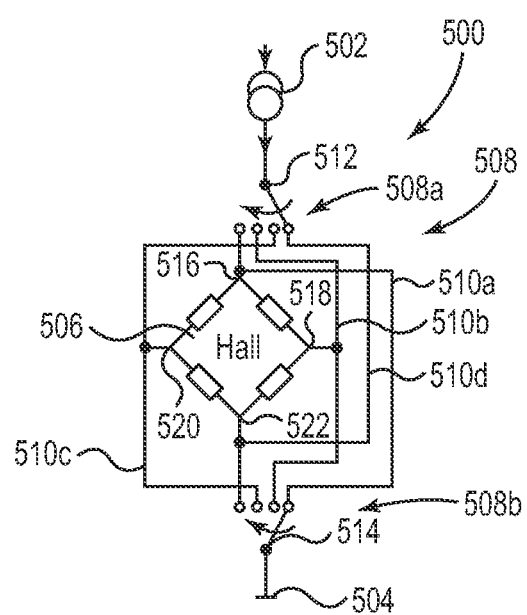
FIG. 9B is a diagram illustrating a spinning current Hall sensor spinning in a second spin direction, which is the inverse of the first spin direction.

FIGS. 9A and 9B are diagrams illustrating one embodiment of a spinning current Hall sensor 500 that provides positive input signals via spinning in a first spin direction and negative input signals via spinning in a second spin direction. Hall sensor 500 includes current source 502, reference 504, Hall sensing element 506, and bi-directional spinning circuit 508. In one embodiment, sensor system 400 of FIGS. 5 and 6 includes Hall sensor 500 instead of Hall sensor 402.

Spinning circuit 508 includes a top spin switch 508a, a bottom spin switch 508b, and four output paths 510a-510d. Top spin switch 508a includes input 512 and bottom spin switch 508b includes input 514. Input 512 of top spin switch 508a is electrically coupled to current source 502 and input 514 of bottom spin switch 508b is electrically coupled to reference 504. The first output path 510a is electrically coupled to the top at 516 of Hall sensing element 506, the second output path 510b is electrically coupled to the right side at 518 of Hall sensing element 506, the third output path 510c is electrically coupled to the left side at 520 of Hall sensing element 506, and the fourth output path 510d is electrically coupled to the bottom at 522 of Hall sensing element 506.

Top spin switch 508a and bottom spin switch 508b are electrically coupled to the four output paths 510a-510d. A first output of top spin switch 508a is electrically coupled to a fourth output of second spin switch 508b via first output path 510a. A second output of top spin switch 508a is electrically coupled to a third output of second spin switch 508b via second output path 510b. A third output of top spin switch 508a is electrically coupled to a second output of second spin switch 508b via third output path 510c, and a fourth output of top spin switch 508a is electrically coupled to a first output of second spin switch 508b via fourth output path 510d.

In operation, control logic, such as control logic 412, controls top and bottom spin switches 508a and 508b to provide a first spin sequence for positive input signals and a second spin sequence for negative input signals. Positive input signals are provided via a first spin sequence that begins with a 0 degree phase, to a 90 degree phase, to a 270 degree phase, to a 180 degree phase as shown in FIG. 5. Negative input signals are provided via a second spin sequence that begins with a 180 degree phase, to a 270 degree phase, to a 90 degree phase, to a 0 degree phase as shown in FIG. 6.

FIG. 9A is a diagram illustrating spinning current Hall sensor 500 spinning in the first spin direction. To provide the first spin sequence, spinning circuit 508 spins the top spin switch 508a and the bottom spin switch 508b from left to right, such that the bias current rotates in the spin sequence from the 0 degree phase, to the 90 degree phase, to the 270 degree phase, to the 180 degree phase. Where, in the 0 degree phase, the bias current flows from the top at 516 to the bottom at 522 of Hall sensing element 506. In the 90 degree phase, the bias current flows from the right side at 518 to the left side at 520 of Hall sensing element 506. In the 270 degree phase, the bias current flows from the left side at 520 to the right side at 518 of Hall sensing element 506, and in the 180 degree phase, the bias current flows from the bottom at 522 to the top at 516 of Hall sensing element 506.

FIG. 9B is a diagram illustrating spinning current Hall sensor 500 spinning in the second spin direction, which is the inverse of the first spin direction. To provide the second spin sequence, spinning circuit 508 spins the top spin switch 508a and the bottom spin switch 508b from right to left, such that the bias current rotates in the spin sequence from the 180 degree phase, to the 270 degree phase, to the 90 degree phase, to the 0 degree phase. In the 180 degree phase, the bias current flows from the bottom at 522 to the top at 516. In the 270 degree phase, the bias current flows from the left side at 520 to the right side at 518. In the 90 degree phase, the bias current flows from the right side at 518 to the left side at 520. In the 0 degree phase, the bias current flows from the top at 516 to the bottom at 522.

Figure 10:
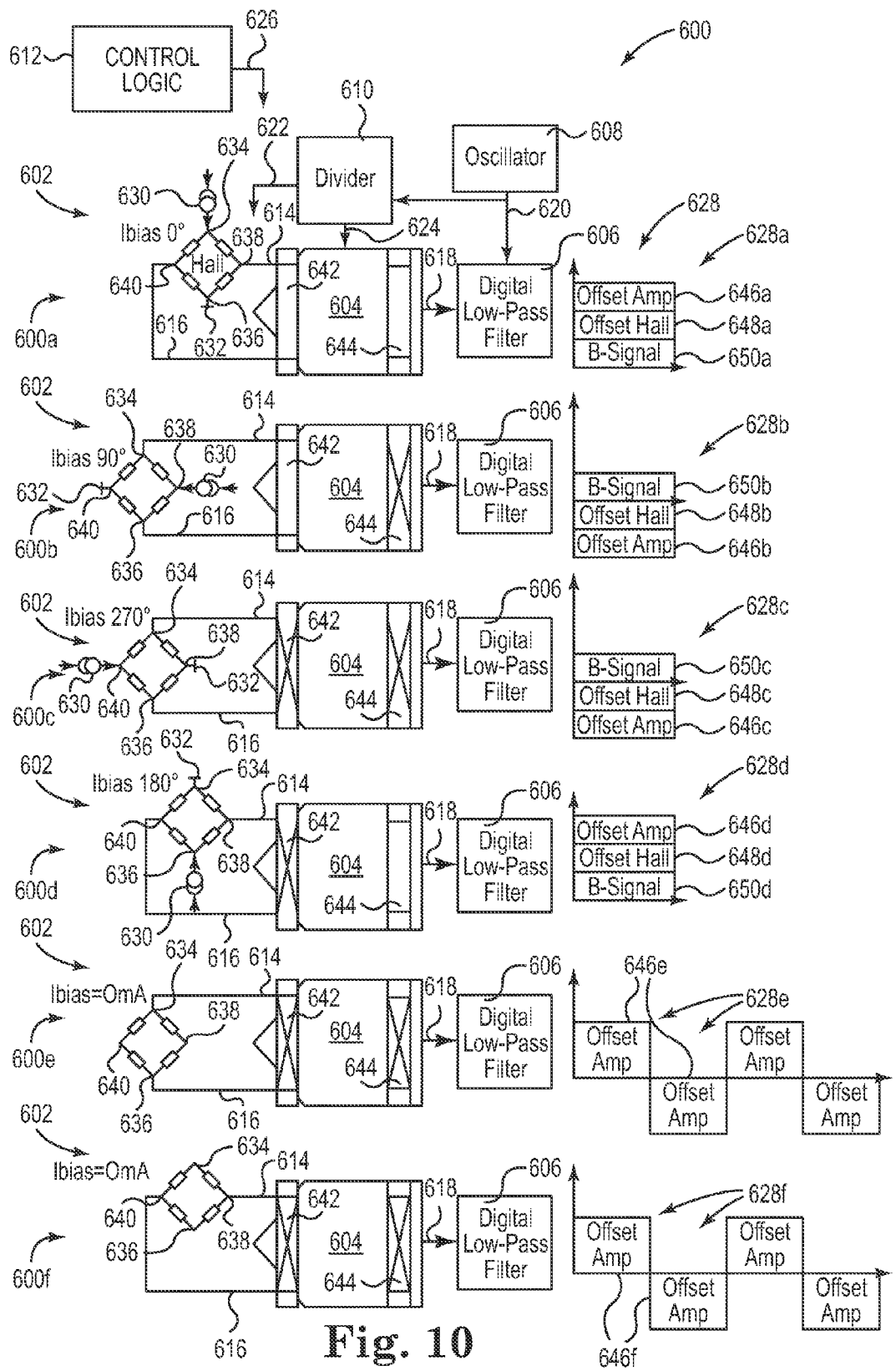
FIG. 10 is a diagram illustrating one embodiment of a sensor system that determines the residual offset calibration signal via two zero-bias phases.

FIG. 10 is a diagram illustrating one embodiment of a sensor system 600 that determines a residual offset calibration signal via at least one zero-bias phase. Sensor system 600 is a spinning current Hall sensor system having four phases with bias current and two zero-bias phases without bias current. In one embodiment, sensor system 600 has a different number of zero-bias phases, such as one or more than two zero-bias phases. In other embodiments, sensor system 600 has a different number of phases.

Sensor system 600 includes spinning current Hall sensor 602, chopping circuit 604, digital low pass filter 606, oscillator 608, clock divider 610, and control logic 612. Hall sensor 602 is electrically coupled to chopping circuit 604 via input signal paths 614 and 616. Chopping circuit 604 is electrically coupled to digital low pass filter 606 via chopped signal path 618. Oscillator 608 is electrically coupled to digital low pass filter 606 and clock divider 610 via clock path 620. Clock divider 610 is electrically coupled to spinning current Hall sensor 602 via spinning clock path 622 and to chopping circuit 604 via chopping clock path 624. Control logic 612 is electrically coupled to Hall sensor 602 and other circuits via control path 626.

In normal mode, Hall sensor 602 spins through a sequence of four phases 600a-600d and provides input signals. Chopping circuit receives the input signals and provides a chopped output signal to digital low pass filter 606 via chopped signal path 618. Digital low pass filter 606 receives the chopped output signal at 618 and provides output signals at 628 that correspond to the input signals.

In residual offset calibration mode, Hall sensor 602 spins through two zero-bias phases 600e and 600f, where a bias current is not supplied to Hall sensor 602. Optionally, the input paths at 614 and 616 are shorted together and/or a replacement resistance is added between the input paths at 614 and 616 during the two zero-bias phases 600e and 600f. Hall sensor 602 spins through the zero-bias phases 600e and 600f and provides input signals. Chopping circuit receives the input signals and provides a chopped output signal to digital low pass filter 606 that receives the chopped output signal at 618 and provides output signals at 628 that correspond to residual offsets of amplifiers, chopping circuit 604 including the chopping switches, and spinning switches. Sensor system 600 measures the residual offsets and determines a residual offset calibration signal. In one embodiment, sensor system 600 measures the impedance of Hall sensor 602 during the two zero-bias phases 600e and 600f. In other embodiments, sensor system 600 spins through the four phases 600a-600d and the two zero-bias phases 600e-600f during the residual offset calibration mode.

Oscillator 608 provides a clock signal to digital low pass filter 606 and clock divider 610 via clock path 620. Digital low pass filter 606 receives and is clocked via the clock signal at 620 to low pass filter the chopped output signals at 618. Clock divider 610 receives the clock signal at 620 and divides the clock signal to provide the spinning clock signal at 622 and the chopping clock signal at 624.

Control logic 612 controls the normal mode and the residual offset calibration mode of sensor system 600. Control logic 612 provides control signals to spinning current Hall sensor 602 and other circuits via control path 626. Control logic 612 provides a control signal, referred to as the residual offset calibration signal, which activates the residual offset calibration mode. In one embodiment, the residual offset calibration mode is activated in normal mode operations. In one embodiment, the residual offset calibration mode is activated between normal mode operations. In one embodiment, the residual offset calibration mode is activated in production. In one embodiment, the residual offset calibration mode is activated via an external circuit, such as a tester.

In one embodiment, the residual offset calibration mode is activated at a first temperature to obtain a first offset calibration value and at a second temperature to obtain a second offset calibration value. Subsequent offset calibration values are calculated from the first offset calibration value and the second offset calibration value based on the current temperature and the first temperature and the second temperature.

Sensor system 600 spins through the four phases 600a-600d in normal mode and through the two zero-bias phases 600e and 600f in the residual offset calibration mode. In one embodiment, sensor system 600 spins through the four phases 600a-600d and the two zero-bias phases 600e and 600f in the residual offset calibration mode.

In the four phases, the first phase is a 0 degree phase at 600a, the second phase is a 90 degree phase at 600b, the third phase is a 270 degree phase at 600c, and the fourth phase is a 180 degree phase at 600d. Sensor system 600 spins from the first phase at 600a, to the second phase at 600b, to the third phase at 600c, and to the fourth phase at 600d. The sequence can then be repeated, beginning with the first phase at 600a.

In the first phase at 600a, spinning current Hall sensor 602 receives a bias current via current source 630, which flows through spinning current Hall sensor 602 to a reference, such as ground, at 632. The bias current flows from the top at 634 to the bottom at 636 of spinning current Hall sensor 602, and the first phase at 600a is referred to as a 0 degree phase. The input paths 614 and 616 are electrically coupled to the right side at 638 and the left side at 640 of spinning current Hall sensor 602, respectively.

Chopping circuit 604 receives the input signals at 614 and 616 and, without crossing the inputs at 642 or the outputs at 644, chopping circuit 604 provides a chopped output signal at 618. Digital low pass filter 606 receives the chopped output signal at 618 and provides output signals at 628a. In the output signals at 628a, amplifier offsets at 646a, Hall sensor offsets at 648a, and magnetic field signals at 650a are all positive.

In the second phase at 600b, spinning current Hall sensor 602 receives the bias current via current source 630, which flows through spinning current Hall sensor 602 to the reference at 632. The bias current flows from the right side at 638 to the left side at 640, and the second phase at 600b is referred to as a 90 degree phase. The input paths 614 and 616 are electrically coupled to the top at 634 and the bottom at 636, respectively.

Chopping circuit 604 receives the input signals at 614 and 616. Chopping circuit 604 does not cross the inputs at 642, but crosses the outputs at 644 to provide the chopped output signal at 618. Digital low pass filter 606 receives the chopped output signal at 618 and provides output signals at 628b. In the output signals at 628b, amplifier offsets at 646b and Hall sensor offsets at 648b are negative and magnetic field signal values at 650b are positive.

In the third phase at 600c, spinning current Hall sensor 602 receives the bias current via current source 630, which flows through spinning current Hall sensor 602 to the reference at 632. The bias current flows from the left side at 640 to the right side at 638, and the third phase at 600c is referred to as a 270 degree phase. The input paths 614 and 616 are electrically coupled to the top at 634 and the bottom at 636, respectively.

Chopping circuit 604 receives the input signals at 614 and 616. Chopping circuit 604 crosses the inputs at 642 and the outputs at 644 to provide the chopped output signal at 618. Digital low pass filter 606 receives the chopped output signal at 618 and provides output signals at 628c. In the output signals at 628c, amplifier offsets at 646c and Hall sensor offsets at 648c are negative and magnetic field signal values at 650c are positive.

In the fourth phase at 600d, spinning current Hall sensor 602 receives the bias current via current source 630, which flows through spinning current Hall sensor 602 to the reference at 632. The bias current flows from the bottom at 636 to the top at 634, and the fourth phase at 600d is referred to as a 180 degree phase. The input paths 614 and 616 are electrically coupled to the right side at 638 and the left side at 640, respectively.

Chopping circuit 604 receives the input signals at 614 and 616. Chopping circuit 604 crosses the inputs at 642, but does not cross the outputs at 644 to provide the chopped output signal at 618. Digital low pass filter 606 receives the chopped output signal at 618 and provides output signals at 628d. In the output signals at 628d, amplifier offsets at 646d, Hall sensor offsets at 648d, and magnetic field signal values at 650d are positive.

If the output signals at 628a-628d are summed, the amplifier offsets at 646a-646d are summed to about zero and the Hall sensor offsets at 648a-648d are summed to about zero. The magnetic field signal values at 650a-650d are summed to a positive signal value.

In the zero-bias phases 600e and 600f, a bias current does not flow through Hall sensor 602. Sensor system 600 spins from the fifth phase at 600e to the sixth phase at 600f. This sequence can then be repeated, beginning with the fifth phase at 600e.

In the fifth phase at 600e, the input paths 614 and 616 are electrically coupled to the top at 634 and the bottom at 636, respectively. Chopping circuit 604 receives the input signals at 614 and 616. Chopping circuit 604 crosses the inputs at 642 and the outputs at 644 to provide the chopped output signal at 618. Digital low pass filter 606 receives the chopped output signal at 618 and provides output signals at 628*e*. In the output signals at 628*e*, amplifier offsets at 646*e* are positive and negative.

In the sixth phase at 600*f*, the input paths 614 and 616 are electrically coupled to the right side at 638 and the left side at 640, respectively. Chopping circuit 604 receives the input signals at 614 and 616. Chopping circuit 604 crosses the inputs at 642 and the outputs at 644 to provide the chopped output signal at 618. Digital low pass filter 606 receives the chopped output signal at 618 and provides output signals at 628*f*. In the output signals at 628*f*, amplifier offsets at 646*f* are positive and negative.

In residual offset calibration mode, Hall sensor 602 spins through the two zero-bias phases 600*e* and 600*f*. Optionally, the input paths at 614 and 616 are shorted together and/or a replacement resistance is added between the input paths at 614 and 616 during the two zero-bias phases 600*e* and 600*f*. Sensor system 600 measures the residual offsets and determines a residual offset calibration signal.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A spinning Hall sensor comprising:
a Hall sensing element with terminals;
wherein the spinning Hall sensor is configured to apply bias signals in a first spin sequence to a first sequence of terminal configurations of the Hall sensing element, the terminals of the Hall sensing element interconnected in the first sequence of the terminal configurations between a bias supply and ground, with the bias supply being connected to and applying the bias signal in each terminal configuration of the first sequence to a different one of the terminals; and
wherein the spinning Hall sensor is configured to apply bias signals in a second spin sequence to a second sequence of the terminal configurations, the terminals of the Hall sensing element interconnected in the second sequence of the terminal configurations between the bias supply and the ground, with the bias supply being connected to and applying the bias signal in each terminal configuration of the second sequence to a different one of the terminals, wherein the bias signals applied in the second spin sequence are inverted from the bias signals applied in the first spin sequence; and
wherein the spinning Hall sensor is configured to provide an output signal based on first signals obtained from Hall sensing measurements in the first spin sequence and second signals obtained from Hall sensing measurements in the second spin sequence.

2. The spinning Hall sensor of claim 1, wherein a residual offset calibration signal is based on demodulated first signals and demodulated second signals, and wherein the residual offset calibration signal is used to calibrate the demodulated first signals and the demodulated second signals to provide the output signal.

3. The spinning Hall sensor of claim 1, comprising:
a chopping circuit configured demodulate the first signals and the second signals and provide corresponding demodulated first signals and demodulated second signals, wherein a residual offset signal is determined based on the demodulated first signals and the demodulated second signals; and
a low pass filter configured to receive the demodulated first signals and the demodulated second signals and provide a positive output signal and a negative output signal, wherein a residual offset calibration signal is determined for the spinning current Hall sensor based on a summation of the residual offset signal, the positive output signal and the negative output signal.

4. The spinning Hall sensor of claim 1, comprising one or more bias signal switches configured to provide the bias signals for the first spin sequence and the inverted bias signal for the second spin sequence.

5. The spinning Hall sensor of claim 1, comprising one or more spin switches configured to apply the bias signals in the first spin sequence to the first sequence of the terminal configurations of the Hall sensing element and to apply the bias signals in the second spin sequence to the second sequence of the terminal configurations of the Hall sensing element.

6. The spinning Hall sensor of claim 1, wherein the spinning Hall sensor is configured to provide the first signals and the second signals during a residual adjustment offset mode.

7. The spinning Hall sensor of claim 1, wherein the spinning Hall sensor is configured to provide the first signals and the second signals during normal mode operation.

8. The spinning Hall sensor of claim 1, wherein a first residual offset calibration signal is based on demodulated first signals and demodulated second signals at a first temperature and a second residual offset calibration signal is based on the demodulated first signals and the demodulated second signals at a second temperature, wherein a third residual offset calibration signal is calculated from the first residual offset calibration signal and the second residual offset calibration signal based on a current temperature, the first temperature and the second temperature, and wherein the third residual offset calibration signal is used to calibrate the demodulated first signals and the demodulated second signals at the current temperature to provide the output signal.

9. The spinning Hall sensor of claim 1, wherein a first residual offset calibration signal is based on demodulated first signals and demodulated second signals at a first chopping frequency and a second residual offset calibration signal is based on the demodulated first signals and the demodulated second signals at a second chopping frequency, wherein a third residual offset calibration signal is calculated from the first residual offset calibration signal and the second residual offset calibration signal based on a current chopping frequency, the first chopping frequency and the second chopping frequency, and wherein the third residual offset calibration signal is used to calibrate the demodulated first signals and the demodulated second signals at the current chopping frequency to provide the output signal.

10. A spinning current Hall sensor system, comprising:
a bias current supply configured to provide a bias current; and
a spinning current Hall sensor with terminals, wherein the spinning current Hall sensor is configured to provide a first sequence of positive input signals in response to the bias current being applied to a first sequence of terminal configurations of the spinning current Hall sensor, wherein the bias current is applied in each terminal configuration of the first sequence to a different one of the terminals, wherein the spinning current Hall sensor is configured to provide a second sequence of negative input signals in response to the bias current being applied to a second sequence of the terminal configurations of the spinning current Hall sensor, wherein the bias current is applied in each terminal configuration of the second sequence to a different one of the terminals; and a chopping circuit configured to demodulate the first sequence of positive input signals and provide a corresponding sequence of demodulated positive signals and to demodulate the second sequence of negative input signals to provide a corresponding sequence of demodulated negative signals, wherein a residual offset calibration signal is used to calibrate the sequence of the demodulated positive signals and the sequence of the demodulated negative signals to provide the output signal.

11. The spinning current Hall sensor system of claim 10, comprising:

a low pass filter configured to receive the sequence of the demodulated positive signals and the sequence of the demodulated negative signals and provide a positive output signal and a negative output signal, wherein a residual offset signal is based on the sequence of the demodulated positive signals and the sequence of the demodulated negative signals, and wherein the residual offset calibration signal is based on a summation of the residual offset signal, the positive output signal and the negative output signal.

12. The spinning current Hall sensor system of claim 10, comprising one or more switches configured to apply the bias current for the first sequence of the terminal configurations of the spinning current Hall sensor and to apply an inverted bias current for the second sequence of the terminal configurations of the spinning current Hall sensor.

13. The spinning current Hall sensor system of claim 10, comprising one or more switches configured to apply the bias current for the first sequence of the terminal configurations of the spinning current Hall sensor and to apply the bias current for the second sequence of the terminal configurations of the spinning current Hall sensor.

14. The spinning current Hall sensor system of claim 10, wherein the spinning current Hall sensor is configured to provide the first sequence of the positive input signals and the second sequence of the negative input signals during a residual adjustment offset mode.

15. The spinning current Hall sensor system of claim 10, wherein the spinning current Hall sensor is configured to provide the first sequence of the positive input signals and the second sequence of the negative input signals during normal mode operation.

16. The spinning current Hall sensor system of claim 10, wherein the residual offset calibration signal is based on the sequence of the demodulated positive signals and the sequence of the demodulated negative signals at a first temperature, wherein a second residual offset calibration signal is based on the sequence of the demodulated positive signals and the sequence of the demodulated negative signals at a second temperature, wherein a third residual offset calibration signal is calculated from the residual offset calibration signal and the second residual offset calibration signal based on a current temperature, the first temperature and the second temperature, and wherein the third residual offset calibration signal is used to calibrate the sequence of demodulated positive signals and the sequence of demodulated negative signals at the current temperature to provide the output signal.

17. The spinning current Hall sensor system of claim 10, wherein the residual offset calibration signal is based on the sequence of the demodulated positive signals and on the sequence of the demodulated negative signals at a first chopping frequency, wherein a second residual offset calibration signal is based on the sequence of the demodulated positive signals and the sequence of the demodulated negative signals at a second chopping frequency, wherein a third residual offset calibration signal is calculated from the residual offset calibration signal and the second residual offset calibration signal based on a current chopping frequency, the first chopping frequency and the second chopping frequency, and wherein the residual offset calibration signal is used to calibrate the sequence of demodulated positive signals and the sequence of demodulated negative signals at the current chopping frequency to provide the output signal.

* * * * *